(12) United States Patent  (10) Patent No.: US 9,202,757 B2
Iguchi et al.  (45) Date of Patent: Dec. 1, 2015

(54) SEMICONDUCTOR MODULE AND METHOD FOR MANUFACTURING SAME

(71) Applicant: KABUSHIKI KAISHA TOSHIBA, Minato-ku (JP)

(72) Inventors: Tomohiro Iguchi, Kanagawa-ken (JP); Masayuki Uchida, Kanagawa-ken (JP); Daisuke Hiratsuka, Kanagawa-ken (JP); Masako Fukumitsu, Kanagawa-ken (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 43 days.

(21) Appl. No.: 14/027,766

(22) Filed: Sep. 16, 2013

(65) Prior Publication Data

US 2014/0264435 A1  Sep. 18, 2014

(30) Foreign Application Priority Data

Mar. 15, 2013  (JP) ................. 2013-053873

(51) Int. Cl.
*H01L 23/48* (2006.01)
*H01L 21/00* (2006.01)
(Continued)

(52) U.S. Cl.
CPC ............ *H01L 21/8232* (2013.01); *H01L 22/32* (2013.01); *H01L 23/053* (2013.01); *H01L 24/06* (2013.01); *H01L 24/49* (2013.01); *H01L 25/072* (2013.01); *H01L 25/18* (2013.01); *H01L 23/3735* (2013.01); *H01L 23/49811* (2013.01);
(Continued)

(58) Field of Classification Search
CPC ............ H01L 21/768; H01L 21/76816; H01L 21/76838; H01L 21/28026; H01L 21/823475; H01L 21/823871; H01L 23/552; H01L 25/16; H01L 27/14636; H01L 2224/19; H01L 2224/25; H01L 2225/06541
USPC ............... 257/13, 79–103, 918, 40, 642–643, 257/759; 438/22–47, 69, 493, 503, 507, 95
See application file for complete search history.

(56) References Cited

U.S. PATENT DOCUMENTS

| 6,943,445 B2* | 9/2005 | Shirakawa et al. ........... 257/724 |
| 2006/0164813 A1* | 7/2006 | Yoshioka et al. .............. 361/717 |
| 2013/0015496 A1* | 1/2013 | Konno et al. ................. 257/140 |

FOREIGN PATENT DOCUMENTS

| JP | 2001-110984 | 4/2001 |
| JP | 2011-110984 | 4/2001 |
| JP | 2004-289103 | 10/2004 |

*Primary Examiner* — Robert Bachner
*Assistant Examiner* — Moin Rahman
(74) *Attorney, Agent, or Firm* — Oblon, McClelland, Maier & Neustadt, L.L.P.

(57) ABSTRACT

According to one embodiment, a semiconductor module includes: a first circuit component: a second circuit component; and a third circuit component. The first circuit component includes: an insulating first substrate; a first conductive layer; a first switching element; and a first diode. The second circuit component includes: an insulating second substrate; a second conductive layer; a second switching element; and a second diode. The second circuit component is disposed between the first circuit component and the third circuit component. The third circuit component includes: an insulating third substrate; a third conductive layer provided on the third substrate and including a third element mounting unit; a third switching element provided on the third element mounting unit; and a third diode provided on the third element mounting unit. A direction from the third switching element toward the third diode is an opposite direction to the first direction.

18 Claims, 6 Drawing Sheets

(51) Int. Cl.
*H01L 21/8232* (2006.01)
*H01L 23/053* (2006.01)
*H01L 21/66* (2006.01)
*H01L 25/07* (2006.01)
*H01L 25/18* (2006.01)
*H01L 23/00* (2006.01)
*H01L 23/373* (2006.01)
*H01L 23/498* (2006.01)

(52) U.S. Cl.
CPC ......... *H01L 24/48* (2013.01); *H01L 2224/0603* (2013.01); *H01L 2224/45014* (2013.01); *H01L 2224/48137* (2013.01); *H01L 2224/48139* (2013.01); *H01L 2224/48472* (2013.01); *H01L 2224/4903* (2013.01); *H01L 2224/49111* (2013.01); *H01L 2224/49175* (2013.01); *H01L 2924/00014* (2013.01); *H01L 2924/13091* (2013.01); *H01L 2924/19107* (2013.01); *H01L 2924/351* (2013.01)

SEMICONDUCTOR MODULE AND METHOD FOR MANUFACTURING SAME

CROSS-REFERENCE TO RELATED APPLICATIONS

This application is based upon and claims the benefit of priority from Japanese Patent Application No. 2013-053873, filed on Mar. 15, 2013; the entire contents of which are incorporated herein by reference.

FIELD

Embodiments described herein relate generally to a semiconductor module and a method for manufacturing same.

BACKGROUND

For a semiconductor module like inverter devices for various uses, it is desired to be highly efficient and highly reliable and be a smaller size. Furthermore, high productivity is required for the semiconductor module.

DETAILED DESCRIPTION

Figure 1:
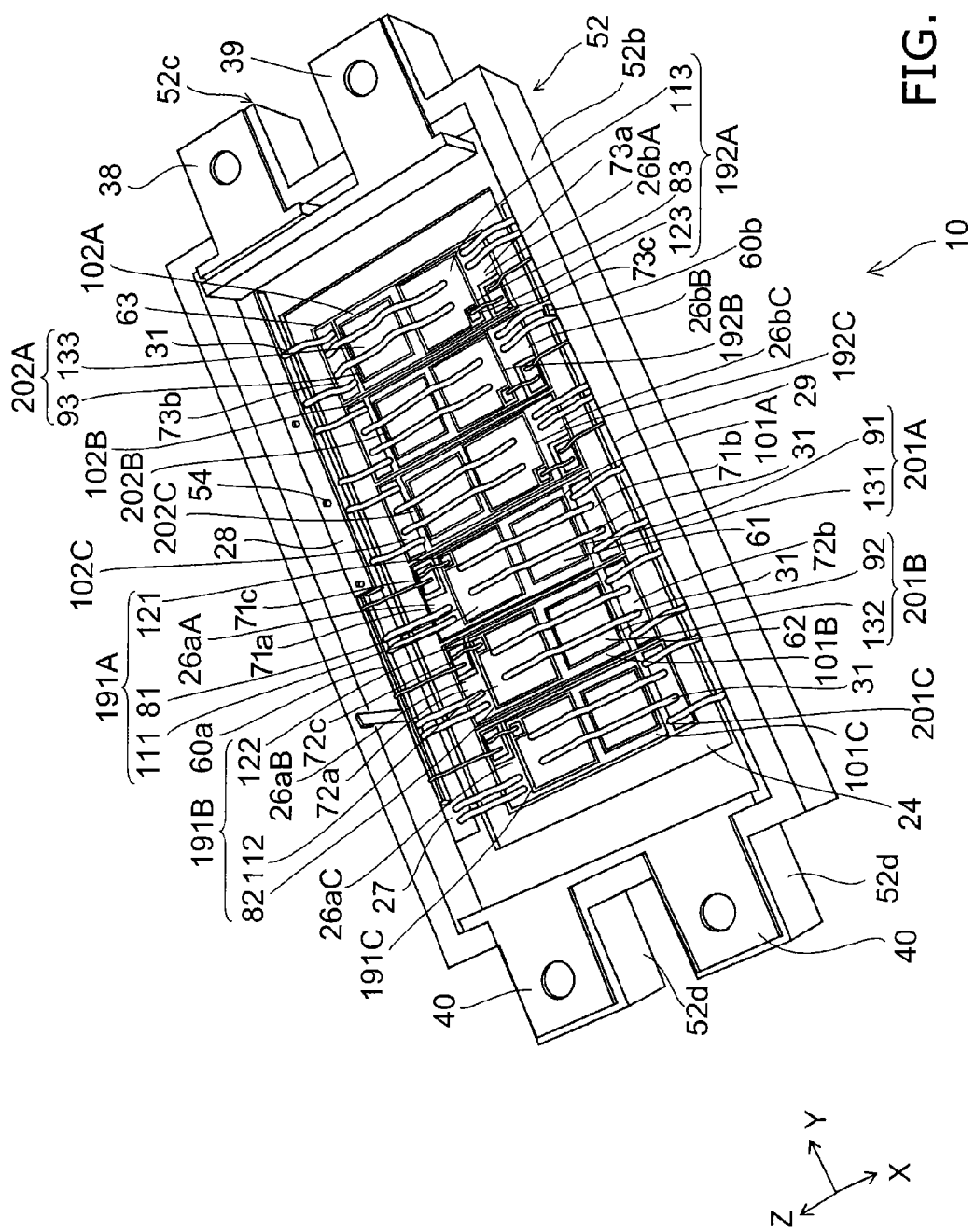
FIG. 1 is a schematic perspective view illustrating a semiconductor module according to a first embodiment.

In general, according to one embodiment, a semiconductor module includes: a first circuit component including: an insulating first substrate; a first conductive layer provided on the first substrate and including a first element mounting unit; a first switching element provided on the first element mounting unit; and a first diode provided on the first element mounting unit; a second circuit component provided apart from the first circuit component in a second direction crossing a first direction from the first switching element toward the first diode and including: an insulating second substrate; a second conductive layer provided on the second substrate and including a second element mounting unit; a second switching element provided on the second element mounting unit; and a second diode provided on the second element mounting unit, a direction from the second switching element toward the second diode being the same direction as the first direction; and a third circuit component, the second circuit component being disposed between the first circuit component and the third circuit component, the third circuit component including: an insulating third substrate; a third conductive layer provided on the third substrate and including a third element mounting unit; a third switching element provided on the third element mounting unit; and a third diode provided on the third element mounting unit, a direction from the third switching element toward the third diode being an opposite direction to the first direction.

In general, according to another embodiment, a method for manufacturing a semiconductor module includes: a test process of performing a processing on a plurality of circuit components, each of the plurality of circuit components including an insulating substrate, a conductive layer including an element mounting unit provided on the substrate, a conductive unit for a main electrode, and a conductive unit for a control electrode, a switching element provided on the element mounting unit and including an element unit and a main electrode and a control electrode provided on an upper surface of the element unit, a diode provided on the element mounting unit and including a diode element unit and a diode electrode provided on an upper surface of the diode element unit, a main wire electrically connecting the conductive unit for a main electrode, the diode electrode, and the main electrode, and a control wire electrically connecting the conductive unit for a control electrode and the control electrode, the processing including investigating characteristics of the switching element and the diode via the element mounting unit, the conductive unit for a main electrode, and the conductive unit for a control electrode of each of the plurality of circuit components and determining whether the switching element and the diode are non-defective items or defective items based on results of the investigation of the characteristics; and a process of disposing a first circuit component, a second circuit component, and a third circuit component out of some of the plurality of circuit components determined as non-defective items in the test process on a base in such a manner that the second circuit component is disposed between the first circuit component and the third circuit component, a first direction from the switching element toward the diode in the first circuit component crosses a direction from the first circuit component toward the second circuit component, a direction from the switching element toward the diode in the second circuit component is the same direction as the first direction, and a direction from the switching element toward the diode in the third circuit component is an opposite direction to the first direction.

Hereinbelow, embodiments are described with reference to the drawings.

The drawings are schematic or conceptual; and the relationships between the thickness and width of portions, the proportions of sizes among portions, etc. are not necessarily the same as the actual values thereof. Further, the dimensions and proportions may be illustrated differently among drawings, even for identical portions.

In the specification of this application and the drawings, components similar to those described in regard to a drawing thereinabove are marked with the same reference numerals, and a detailed description is omitted as appropriate.

First Embodiment

A semiconductor module according to the embodiment includes a semiconductor module used for an electric power converter such as an inverter device, for example.

Figure 2:
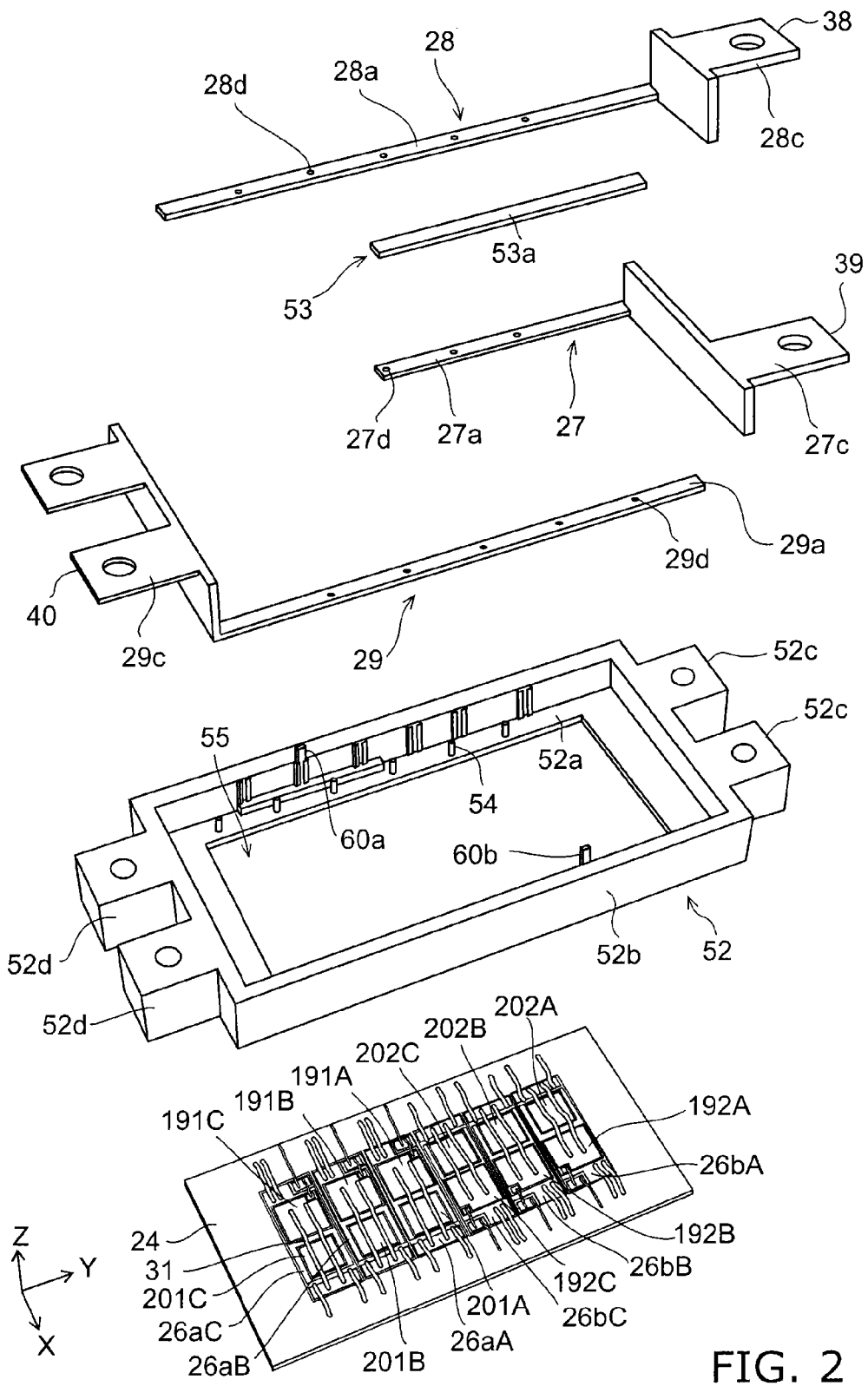
FIG. 2 is a schematic disassembled perspective view illustrating the semiconductor module according to the first embodiment.
Figure 3:
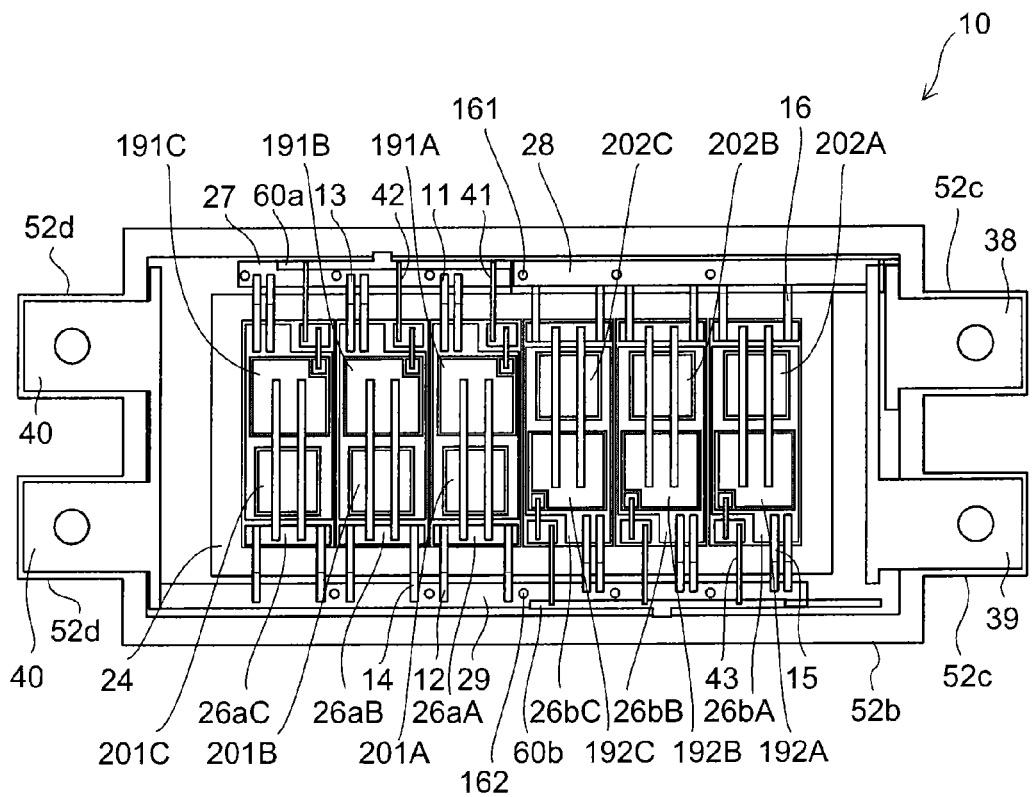
FIG. 3 is a schematic plan view showing the semiconductor module according to the first embodiment.
Figure 4:
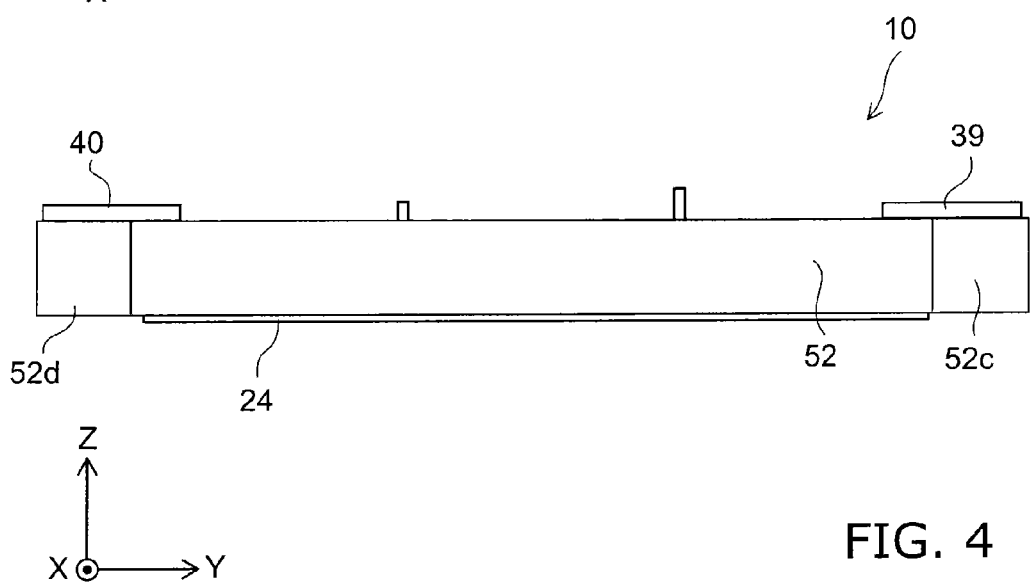
FIG. 4 is a schematic side view showing the semiconductor module according to the first embodiment.
Figure 5:
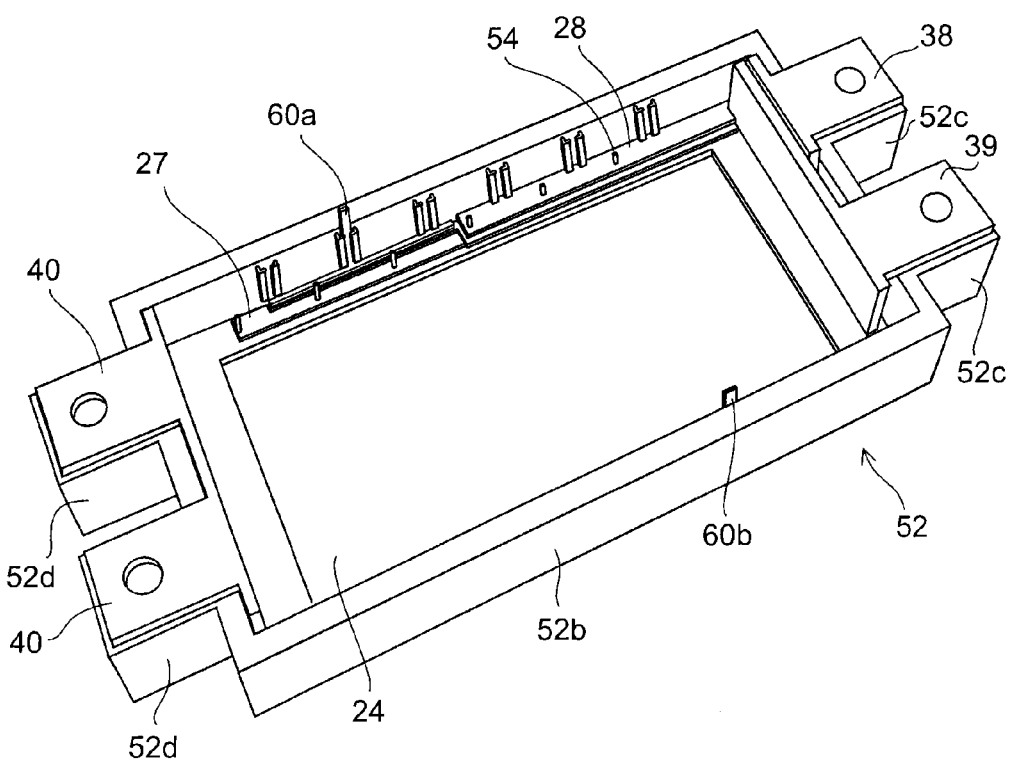
FIG. 5 is a perspective view illustrating the semiconductor module according to the first embodiment.
Figure 6A:
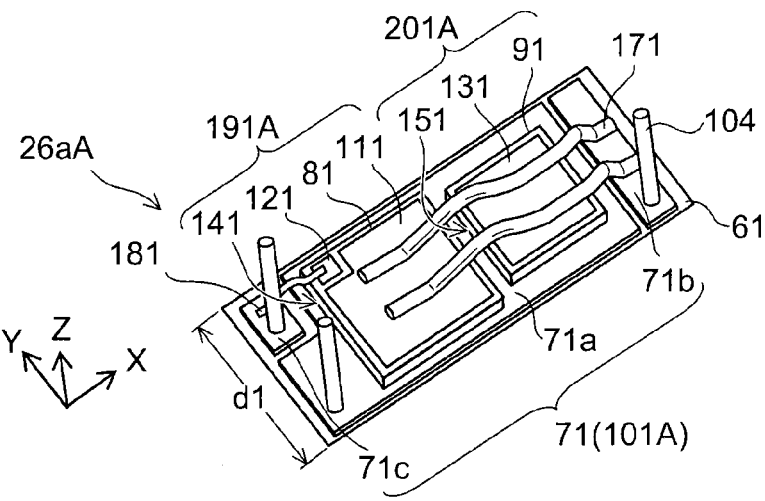
FIG. 6A to FIG. 6C are perspective views illustrating mounting substrates according to the first embodiment.
Figure 6B:
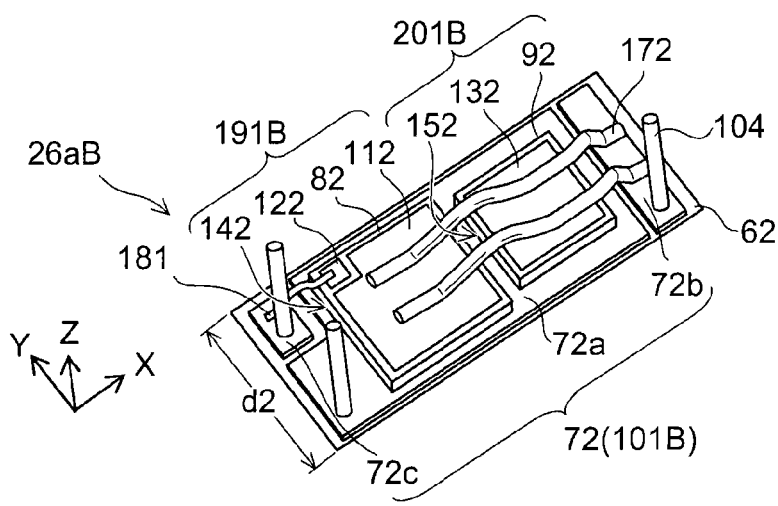
Figure 6C:
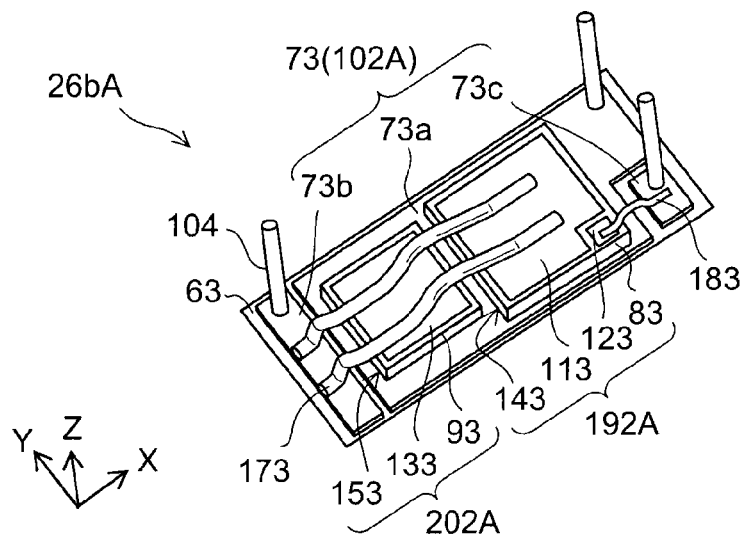

FIG. 1 is a schematic perspective view illustrating a semiconductor module according to a first embodiment. FIG. 2 is a schematic disassembled perspective view illustrating the semiconductor module according to the first embodiment. FIG. 3 is a schematic plan view showing the semiconductor module according to the first embodiment. FIG. 4 is a schematic side view showing the semiconductor module according to the first embodiment. FIG. 5 is a perspective view illustrating the semiconductor module according to the first embodiment. FIG. 6A to FIG. 6C are perspective views illustrating mounting substrates according to the first embodiment.

FIG. 1 to FIG. 3 show an example of a semiconductor module 10. In the semiconductor module 10 illustrated in these drawings, three first mounting substrates 26aA to 26aC and three second mounting substrates 26bA to 26bC are provided.

As shown in FIG. 1 to FIG. 3, the semiconductor module 10 includes a rectangular heat sink 24 functioning as a base. The semiconductor module 10 further includes the plurality of first mounting substrates 26aA, 26aB, and 26aC (circuit components) and the plurality of second mounting substrates 26bA, 26bB, and 26bC (circuit components) arranged on the upper surface of the heat sink, that is, on the installation surface. The semiconductor module 10 further includes switching elements 191A, 191B, and 191C as first semiconductor elements and diodes 201A, 201B, and 201C mounted on the plurality of first mounting substrates 26aA, 26aB, and 26aC. The semiconductor module 10 further includes switching elements 192A, 192B, and 192C as second semiconductor elements and diodes 202A, 202B, and 202C mounted on the second mounting substrates 26bA, 26bB, and 26bC. The semiconductor module 10 further includes a first conductor 27 (e.g. a positive electrode-side conductor), a second conductor 28 (e.g. a negative electrode-side conductor), an output conductor 29, a resin case 52, an insulating plate 53, and bonding wires 31 for connection interconnections (connection conductors).

In the specification of this application, the state of being "provided on" includes not only the state of being provided in direct contact but also the state of being provided via another component.

Copper is used for the heat sink 24, for example. A ceramic material plated with a metal and the like are used for the heat sink 24, for example. The first mounting substrates 26aA, 26aB, and 26aC and the second mounting substrates 26bA, 26bB, and 26bC are formed by directly joining a metal circuit pattern of copper or the like to the front and back surfaces of an insulating substrate of a ceramic or the like, for example. The first mounting substrates 26aA, 26aB, and 26aC and the second mounting substrates 26bA, 26bB, and 26bC may be formed by indirectly joining a metal circuit pattern of copper or the like to the front and back surfaces of an insulating substrate of a ceramic or the like, for example. The heat sink 24 has a long side and a short side shorter than the long side, for example. The heat sink 24 may be a square. The first mounting substrates 26aA, 26aB, and 26aC and the second mounting substrates 26bA, 26bB, and 26bC are joined onto the heat sink 24 using solder or the like, and are arranged to be aligned in a direction along a side (e.g. the long side) of the heat sink 24, for example.

The direction from the heat sink 24 (base) toward the first mounting substrates 26aA to 26aC and the second mounting substrates 26bA to 26bC is defined as a stacking direction (the Z-axis direction). One direction orthogonal to the Z-axis direction is defined as the X-axis direction. The direction orthogonal to the Z-axis direction and the X-axis direction is defined as the Y-axis direction.

The switching elements 191A to 191C and the diodes 201A to 201C are mounted on circuit patterns 101A to 101C (conductive layers) of the first mounting substrates 26aA, 26aB, and 26aC, and the switching elements 191A to 191C and the diodes 201A to 201C are connected in parallel to one another via the circuit patterns 101A, 101B, and 101C of the first mounting substrates 26aA, 26aB, and 26aC connected to the respective upper electrodes by wires. A Ribbon or connector connection may be used the electric connections. Thus, the positive electrode side of an inverter circuit is formed. The first mounting substrates 26aA, 26aB, and 26aC, the switching elements 191A to 191C, and the diodes 201A to 201C form a drive signal input unit.

The switching elements 192A to 192C and the diodes 202A to 202C are mounted on circuit patterns 102A to 102C (conductive layers) of the second mounting substrates 26bA, 26bB, and 26bC, and the switching elements 192A to 192C and the diodes 202A to 202C are connected in parallel to one another via the circuit patterns 102A, 102B, and 102C of the second mounting substrates 26bA, 26bB, and 26bC connected to the respective upper electrodes. Thus, the negative electrode side of the inverter circuit is formed. The second mounting substrates 26bA, 26bB, and 26bC, the switching elements 192A to 192C, and the diodes 202A to 202C form a drive signal input unit.

A first circuit component corresponds to the first mounting substrate 26aA, for example. A second circuit component corresponds to the first mounting substrate 26aB, for example. A third circuit component corresponds to the second mounting substrate 26bA, for example.

Examples of the structures of the first circuit component, the second circuit component, and the third circuit component will now be described with reference to FIG. 6A to FIG. 6C.

FIG. 6A shows an example of the first circuit component (e.g. the first mounting substrate 26aA). The first circuit component includes a first substrate 61, a first conductive layer 71 (e.g. the circuit pattern 101A), a first switching element (e.g. the switching element 191A), and a first diode (e.g. the diode 201A), for example.

The first substrate 61 has insulating properties, for example. The first conductive layer 71 is provided on the first substrate 61, for example. The first conductive layer 71 includes a first element mounting unit 71a, a first conductive unit for a main electrode 71b, and a first conductive unit for a control electrode 71c, for example.

At least part of the first element mounting unit 71a, at least part of the first conductive unit for a main electrode 71b, and at least part of the first conductive unit for a control electrode 71c function as a probe space that a probe 104 is brought into contact with in an electrical characteristic test described later, for example.

The first switching element is provided on the first element mounting unit 71a, for example. The first diode is provided on the first element mounting unit 71a, for example. The direction from the first switching element toward the first diode is a first direction, for example. In this example, the first direction is the X-axis direction.

The first switching element includes a first element unit 81, a first main electrode 111, and a first control electrode 121, for example. The first main electrode 111 is provided on the upper surface of the first element unit 81, for example. The first control electrode 121 is provided on the upper surface of the first element unit 81, for example. The first control electrode 121 is apart from the first main electrode 111, for example.

The first main electrode 111 is electrically connected to the first conductive unit for a main electrode 71b, for example. The first main electrode 111 and the first conductive unit for a main electrode 71b are connected together by a first main wire 171, for example. The first control electrode 121 is electrically connected to the first conductive unit for a control electrode 71c, for example. The first control electrode 121 and the first conductive unit for a control electrode 71c are connected together by a first control wire 182, for example.

The bonding wire 31 may be used as the first main wire 171 and the first control wire 181, for example.

The first switching element further includes a first element lower electrode 141, for example. The first element lower electrode 141 is provided on the lower surface of the first switching element, for example. The lower surface of the first switching element is the surface on the opposite side to the upper surface of the first switching element, for example.

The first diode includes a first diode element unit 91 and a first diode upper electrode 131, for example. The first diode upper electrode 131 is provided on the upper surface of the first diode element unit 91, for example. The first diode upper electrode 131 is electrically connected to the first main electrode 111 and the first conductive unit for a main electrode 71b by the first main wire 171, for example.

The first diode further includes a first diode lower electrode 151, for example. The first diode lower electrode 151 is provided on the lower surface of the first diode, for example. The lower surface of the first diode is the surface on the opposite side to the upper surface of the first diode, for example.

The first main electrode 111, the first control electrode 121, and the first diode upper electrode 131 are upper electrodes, for example.

As shown in FIG. 6A, the length along a second direction of the first substrate 61 (the width of the first substrate 61) d1 is less than twice the length along the second direction of the first switching element (the first element unit 81) (the width of the first switching element). The length d1 is also less than twice the length along the second direction of the first diode (the first diode element unit 91) (the width of the first diode).

That is, only one switching element and one diode are provided on the first substrate 61, for example. Thereby, the first substrate 61 can be downsized. If the first substrate 61 is large, the first conductive layer 71 etc. provided on the first substrate 62 may be peeled off due to the linear expansion of the first substrate 61 etc., for example. By downsizing the first substrate 61, reliability can be enhanced.

FIG. 6B shows an example of the second circuit component (e.g. the first mounting substrate 26aB). The second circuit component includes a second substrate 62, a second conductive layer 72 (e.g. the circuit pattern 101B), a second switching element (e.g. the switching element 191B), and a second diode (e.g. the diode 201B), for example. The second circuit component is away from the first circuit component in the second direction (e.g. the Y-axis direction) crossing the first direction, for example.

The second substrate 62 has insulating properties, for example. The second conductive layer 72 is provided on the second substrate 62, for example. The second conductive layer 72 includes a second element mounting unit 72a, a second conductive unit for a main electrode 72b, and a second conductive unit for a control electrode 72c, for example.

Also at least part of the second element mounting unit 72a, at least part of the second conductive unit for a main electrode 72b, and at least part of the second conductive unit for a control electrode 72c function as a probe space that the probe 104 is brought into contact with in the electrical characteristic test described later, for example.

The second switching element is provided on the second element mounting unit 72a, for example. The second diode is provided on the second element mounting unit 72a, for example. The direction from the second switching element toward the second diode is the same as the direction from the first switching element toward the first diode. The direction from the second switching element toward the second diode is the first direction (e.g. the X-axis direction), for example.

The second switching element includes a second element unit 82, a second main electrode 112, and a second control electrode 122, for example. The second main electrode 112 is provided on the upper surface of the second element unit 82, for example. The second control electrode 122 is provided on the upper surface of the second element unit 81, for example. The second control electrode 122 is apart from the second main electrode 112, for example.

The second main electrode 112 is electrically connected to the second conductive unit for a main electrode 72b, for example. The second main electrode 112 and the second conductive unit for a main electrode 72b are connected together by a second main wire 172, for example. The second control electrode 122 is electrically connected to the second conductive unit for a control electrode 72c, for example. The second control electrode 122 and the second conductive unit for a control electrode 72c are connected together by a second control wire 182, for example.

The bonding wire 31 may be used as the second main wire 172 and the second control wire 182, for example.

The second switching element further includes a second element lower electrode 142, for example. The second element lower electrode 142 is provided on the lower surface of the second switching element, for example. The lower surface of the second switching element is the surface on the opposite side to the upper surface of the second switching element, for example.

The second diode includes a second diode element unit 92 and a second diode upper electrode 132, for example. The second diode upper electrode 132 is provided on the upper surface of the second diode element unit 92, for example. The second diode upper electrode 132 is electrically connected to the second main electrode 112 and the second conductive unit for a main electrode 72b by the second main wire 172, for example.

The second diode further includes a second diode lower electrode 152, for example. The second diode lower electrode 152 is provided on the lower surface of the second diode, for example. The lower surface of the second diode is the surface on the opposite side to the upper surface of the second diode, for example.

The second main electrode 112, the second control electrode 122, and the second diode upper electrode 132 are upper electrodes, for example.

As shown in FIG. 6B, the length along the second direction of the second substrate 62 (the width of the second substrate 62) d2 is less than twice the length along the second direction of the second switching element (the second element unit 82) (the width of the second switching element). The length d2 is also less than twice the length along the second direction of the second diode (the second diode element unit 92) (the width of the second diode).

That is, only one switching element and one diode are provided on the second substrate 62 either, for example. Thereby, the second substrate 62 can be downsized, and reliability can be enhanced.

FIG. 6C shows an example of the third circuit component (e.g. the second mounting substrate 26bA). The third circuit component includes a third substrate 63, a third conductive layer 73 (e.g. the circuit pattern 102A), a third switching element (e.g. the switching element 192A), and a third diode (e.g. the diode 202A), for example. The second circuit component is provided between the first circuit component and the third circuit component, for example.

The third substrate 63 has insulating properties, for example. The third conductive layer 73 is provided on the third substrate 63, for example. The third conductive layer 73 includes a third element mounting unit 73*a*, a third conductive unit for a main electrode 73*b*, and a third conductive unit for a control electrode 73*c*, for example.

Also at least part of the third element mounting unit 73*a*, at least part of the third conductive unit for a main electrode 73*b*, and at least part of the third conductive unit for a control electrode 73*c* function as a probe space that the probe 104 is brought into contact with in the electrical characteristic test described later, for example.

The third switching element is provided on the third element mounting unit 73*a*, for example. The third diode is provided on the third element mounting unit 73*a*, for example. The direction from the third switching element toward the third diode is the direction opposite to the first direction (e.g. the −X-axis direction), for example.

The third switching element includes a third element unit 83, a third main electrode 113, and a third control electrode 123, for example. The third main electrode 113 is provided on the upper surface of the third element unit 83, for example. The third control electrode 123 is provided on the upper surface of the third element unit 83, for example. The third control electrode 123 is apart from the third main electrode 113, for example.

The third main electrode 113 is electrically connected to the third conductive unit for a main electrode 73*b*, for example. The third main electrode 113 and the third conductive unit for a main electrode 73*b* are connected together by a third main wire 173, for example. The third control electrode 123 is electrically connected to the third conductive unit for a control electrode 73*c*, for example. The third control electrode 123 and the third conductive unit for a control electrode 73*c* are connected together by a third control wire 183, for example.

The bonding wire 31 may be used as the third main wire 173 and the third control wire 183, for example.

The third switching element further includes a third element lower electrode 143, for example. The second element lower electrode 143 is provided on the lower surface of the third switching element, for example. The lower surface of the third switching element is the surface on the opposite side to the upper surface of the third switching element, for example.

The third diode includes a third diode element unit 93 and a third diode upper electrode 133, for example. The third diode upper electrode 133 is provided on the upper surface of the third diode element unit 93, for example. The third diode upper electrode 133 is electrically connected to the third main electrode 113 and the third conductive unit for a main electrode 73*b* by the third main wire 173, for example.

The third diode further includes a third diode lower electrode 153, for example. The third diode lower electrode 153 is provided on the lower surface of the third diode, for example. The lower surface of the third diode is the surface on the opposite side to the upper surface of the third diode, for example.

The third main electrode 113, the third control electrode 123, and the third diode upper electrode 133 are upper electrodes, for example.

As shown in FIG. 6C, the length along the second direction of the third substrate 63 (the width of the third substrate 63) d3 is less than twice the length along the second direction of the third switching element (the third element unit 83) (the width of the third switching element). The length d3 is also less than twice the length along the second direction of the third diode (the third diode element unit 93) (the width of the third diode).

That is, only one switching element and one diode are provided on the third substrate 63 either, for example. Thereby, the third substrate 63 can be downsized, and reliability can be enhanced.

The first circuit component, the second circuit component, and the third circuit component are provided on the installation surface of the base (e.g. the heat sink 24), for example. The installation surface of the base is insulating, for example.

As shown in FIG. 1 to FIG. 5, the resin case 52 is formed in a rectangular frame shape. The resin case 52 integrally includes a rectangular bottom surface portion 52*a* with a size corresponding to the heat sink 24, a frame-shaped side wall 52*b* vertically provided around the bottom surface portion 52*a*, two terminal support portions 52*c* protruding from the side of one short side of the side wall 52*b* to the outside in a direction along the long side, and two terminal support portions 52*d* protruding from the side of the other short side of the side wall 52*b* to the outside in a direction along the long side. A rectangular opening 55 is formed in the bottom surface portion 52*a*. The bottom surface portion 52*a* of the resin case 52 is attached and fixed to the upper surface of the heat sink 24. At this time, the first mounting substrates 26*a*A, 26*a*B, and 26*a*C and the second mounting substrates 26*b*A, 26*b*B, and 26*b*C are located in the opening 55 of the resin case 52, and are exposed in the resin case 52.

A large number of positioning pins 54 are vertically provided in the bottom surface portion 52*a* of the resin case 52. The positioning pins 54 are arranged to be aligned at prescribed intervals along the two side walls 52*b* in a direction along the long side of the bottom surface portion 52*a*.

As shown in FIG. 2, the first conductor 27 is formed of a plate material in a long, thin strip shape, for example. A positive electrode terminal 38 is electrically connected to the first conductor 27. One end of the first conductor 27 in a direction along the long side is connected to the positive electrode terminal 38, for example. Herein, the first conductor 27 and the positive electrode terminal 38 are integrally formed of a metal plate, or are integrally formed by plating the surface of an insulator with a metal. That is, the first conductor 27 is formed of a metal plate in a long, thin strip shape, and has a first flat plate region 27*a* in a long, thin, flat form, a curved region curved and extending from one end of the first flat plate region 27*a* via a bent portion, and a second flat plate region 27*c* extending from the curved region via a bent portion. The second flat plate region 27*c* forms the positive electrode terminal 38. The positive electrode terminal 38 is one step higher than the first flat plate region 27*a*, and extends almost parallel to the first flat plate region 27*a*.

The first conductor 27 serves as an internal interconnection for supplying electric power from the positive electrode terminal 38 to the circuit patterns 101A to 101C of the first mounting substrates 26*a*A, 26*a*B, and 26*a*C. A plurality of positioning holes 27*d* are formed in the first flat plate region 27*a* of the first conductor 27, and the plurality of positioning holes 27*d* are aligned at prescribed intervals in a direction along the long side of the first flat plate region 27*a*.

The first flat plate region 27*a* of the first conductor 27 is attached onto the bottom surface portion 52*a* in a state of being positioned in a prescribed position with respect to the resin case 52 by inserting the positioning pins 54 on the resin case 52 side into the positioning holes 27*d*. The first flat plate region 27*a* of the first conductor 27 extends along one side wall 52*d* along the long side, and is located adjacent to the lateral side of the first mounting substrates 26*a*A to 26*a*C and the second mounting substrates 26*b*A to 26*b*C. The curved region of the first conductor 27 extends along the side wall 52*b* along the short side of the resin case 52, and the second flat plate region 27c, that is, the positive electrode terminal 38 is held on the terminal support portion 52c.

The second conductor 28 is formed of a plate material in a long, thin strip shape. A negative electrode terminal 39 is electrically connected to the second conductor 28. One end of the second conductor 28 in a direction along the long side is connected to the negative electrode terminal 39, for example. The second conductor 28 and the negative electrode terminal 39 are integrally formed of a metal plate, or are integrally formed by plating the surface of an insulator with a metal. The second conductor 28 is formed of a metal plate in a long, thin strip shape, and has a first flat plate region 28a in a long, thin, flat form, a curved region curved and extending from one end of the first flat plate region via a bent portion, and a second flat plate region 28c extending from the curved region via a bent portion. The second flat plate region forms the negative electrode terminal 39. The negative electrode terminal 39 is one step higher than the first flat plate region 28a, and extends almost parallel to the first flat plate region 28a. In the embodiment, the negative electrode terminal 39 is formed so as to be located in almost the same plane as the positive electrode terminal 38.

The second conductor 28 forms an internal interconnection from the circuit patterns 102A, 102B, and 102C of the second mounting substrates 26bA, 26bB, and 26bC connected to the upper electrodes of the switching elements and the diodes mounted on the second mounting substrates 26bA, 26bB, and 26bC to the negative electrode terminal 39. A plurality of positioning holes 28d are formed in the first flat plate region 28a of the second conductor 28, and the positioning holes 28d are aligned at prescribed intervals in a direction along the long side of the first flat plate region 28a.

The first conductor 27 and the second conductor 28 are formed with almost the same width, and the first flat plate region 28a of the second conductor 28 is formed with a shorter length than the first flat plate region 27a of the first conductor 27. The first flat plate region 28a of the second conductor 28 is provided to be superposed on the first flat plate region 27a of the first conductor 27 in a state of being positioned in a prescribed position with respect to the resin case 52 by inserting the positioning pins 54 on the resin case 52 side into the positioning holes 28d.

The first flat plate region 28a of the second conductor 28 extends along one side wall 52d along the long side, and is located on the lateral side of the first mounting substrates 26aA, 26aB, and 26aC and the second mounting substrates 26bA, 26bB, and 26bC. The curved region of the second conductor 28 extends along the side wall 52b along the short side of the resin case 52, and the second flat plate region 28c, that is, the positive electrode terminal 38 is held on the terminal support portion 52c. At this time, the curved region of the second conductor 28 is aligned separately with the curved region of the first conductor 27.

The insulating plate 53 as an insulating member is formed in a long, thin strip shape, and has almost the same length as the first flat plate region 28a of the second conductor 28. A plurality of positioning holes 53a are formed in the insulating plate 53, and the positioning holes 53a are aligned at prescribed intervals in a direction along the long side. The insulating plate 53 is disposed to be superposed on the first flat plate region 27a of the first conductor 27 in a state of being positioned in a prescribed position with respect to the resin case 52 by inserting the positioning pins 54 on the resin case 52 side into the positioning holes 53a. Thereby, the insulating plate 53 is disposed between the first flat plate region 27a of the first conductor 27 and the first flat plate region 28a of the second conductor 28, and insulates both.

The first flat plate region 27a of the first conductor 27 is formed longer than the first plat plate region 27a of the second conductor 28. The tip (one end) of the first flat plate region 27a of the first conductor 27 protrudes from the stacked unit formed of the first conductor 27, the insulating plate 53, and the second conductor 28, and extends along one side of the first mounting substrates 26aA to 27aC.

The output conductor 29 is formed of a plate material in a long, thin strip shape. Output terminals 40 are electrically connected to the output conductor 29. One end of the output conductor 29 in a direction along the long side is connected to a pair of output terminals 40, for example. In the embodiment, the output conductor 29 and the output terminal 40 are integrally formed of a metal plate, or are integrally formed by plating the surface of an insulator with a metal. The output conductor 29 is formed of a metal plate in a long, thin strip shape, and has a first flat plate region 29a in a long, thin, flat form, a curved region curved and extending from one end of the first flat plate region 29a via a bent portion, and two second flat plate regions 29c extending from the curved region via a bent portion. The second flat plate regions 29c form the output terminals 40. The output terminal 40 is one step higher than the first flat plate region 29a, and extends almost parallel to the first flat plate region 29a.

The output conductor 29 forms an internal interconnection from the circuit patterns 101A, 1018, and 101C of the first mounting substrates 26aA, 26aB, and 26aC connected to the upper electrodes of the switching elements 191A to 191C and the diodes 201A to 201C on the first mounting substrates 26aA, 26aB, and 26aC to the circuit patterns 102A to 102C of the second mounting substrates 26bA, 26bB, and 26bC, and forms an interconnection path to the output terminal 40. A plurality of positioning holes 29d are formed in the first flat plate region 29a of the output conductor 29, and the positioning holes 29d are aligned at prescribed intervals in a direction along the long side of the first flat plate region 29a.

The first flat plate region 29a of the output conductor 29 is attached onto the bottom surface portion 52a in a state of being positioned in a prescribed position with respect to the resin case 52 by inserting the positioning pins 54 on the resin case 52 side into the positioning holes 29d. The first flat plate region 29a of the output conductor 29 extends along the other side wall 52b along the long side, and is located on the lateral side of the first mounting substrates 26aA to 26aC and the second mounting substrates 26bA to 26bC. The first flat plate region 29a of the output conductor 29 is disposed on the opposite side to the stacked body of the first flat plate regions 27a and 28a of the first conductor 27 and the second conductor 28 across the first mounting substrates 26aA, 26aB, and 26aC and the second mounting substrates 26bA, 26bB, and 26bC. The curved region of the output conductor 29 extends along the short side of the resin case 52. The pair of output terminals 40 are held on the terminal support portions 52d.

The first conductor 27 extends in the second direction (e.g. the Y-axis direction), for example. The second conductor 28 extends in the second direction, for example. At least part of the second conductor 28 overlaps with the first conductor 27 in the stacking direction (e.g. the Z-axis direction) crossing the first direction and the second direction. The insulating member is the insulating plate 53, for example. The insulating member is provided between the first conductor 27 and at least part of the portion overlapping with the first conductor 27 of the second conductor 28, for example.

A third conductor is the output conductor 29, for example. The third conductor extends in the second direction (e.g. the Y-axis direction), for example. The third conductor is apart from the first conductor 27, the second conductor 28, and the insulating member in the first direction, for example.

The first circuit component, the second circuit component, and the third circuit component are disposed between the first conductor 27, the second conductor 28, and the insulating member, and the third conductor.

The first conductor 27 is electrically connected to the first element mounting unit 71a and the second element mounting unit 72a, for example. The second conductor 28 is electrically connected to the third conductive unit for a main electrode 73b, for example. The third conductor (e.g. the output conductor 29) is electrically connected to the first conductive unit for a main electrode 71b, the second conductive unit for a main electrode 72b, and the third element mounting unit 73a, for example.

A bonding wire described later may be used for these electrical connections, for example. In addition, a ribbon or connector connection may be used the electric connections.

As shown in FIG. 2 and FIG. 4, a gate signal input terminal 60a is attached to a portion of one side wall 52b of the resin case 52 near the first mounting substrate 26a. A gate signal input terminal 60b is attached to a portion of the other side wall 52b near the second mounting substrate 26b. Source terminals (not shown) may be provided individually at a portion of the one side wall 52b of the resin case 52 near the first mounting substrate 26a and a portion of the other side wall 52b near the second mounting substrate 26b, for example.

The gate signal input terminal 60a (a first gate signal input terminal) is electrically connected to the first conductive unit for a control electrode 71c and the second conductive unit for a control gate 72c, for example. The gate signal input terminal 60b (a second gate signal input terminal) is electrically connected to the third conductive unit for a control electrode 73c, for example.

The bonding wire described later may be used also for these electrical connections, for example. In addition, a ribbon or connector connection may be used the electric connections.

The first conductor 27, the second conductor 28, the insulating plate 53, and the output conductor 29 attached onto the bottom surface portion 52a of the resin case 52 in the above way are fixed and positioned by changing the shapes of the protruding ends of the positioning pins 54 by heat or the like. The first conductor 27 and the output conductor 29, and the heat sink 24 are insulated from each other by the bottom surface portion 52a of the resin case 52 having insulating properties.

The cabinet is the resin case 52, for example. At least part of the base (the heat sink 24), the first conductor 27, the second conductor 28, the third conductor (the output conductor 29), and the insulating member (the insulating plate 53) are provided on the bottom surface portion 52a, for example. At this time, the base is provided between the first conductor 27, the second conductor 28, and the insulating member, and the third conductor.

The cabinet (the resin case 52) further includes a first positioning member 161 and a second positioning member 162, for example. The first positioning member 161 is vertically provided on the bottom surface portion 52a of the cabinet (the resin case 52). The second positioning member 162 is vertically provided on the bottom surface portion 52a. The second positioning member 162 is apart from the first positioning member 161, for example. The base (the heat sink 24) is provided between the first positioning member 161 and the second positioning member 162, for example. The first positioning member 161 may be provided in plural along the second direction, for example. The second positioning member 162 may be provided in plural along the second direction, for example.

The first conductor 27 has a first through hole (e.g. the positioning hole 27d), for example. The first through hole penetrates through the first conductor 27 in the stacking direction (e.g. the Z-axis direction), for example. The first through hole is provided in plural, for example.

The second conductor 28 has a second through hole (e.g. the positioning hole 28d), for example. The second through hole penetrates through the second conductor 28 in the stacking direction (e.g. the Z-axis direction), for example. The second through hole is provided in plural, for example.

The third conductor (the output conductor 29) has a third through hole (e.g. the positioning hole 29d), for example. The third through hole penetrates through the third conductor in the stacking direction (e.g. the Z-axis direction), for example. The third through hole is provided in plural, for example.

The first positioning member 161 penetrates through the first through hole and the second through hole, for example. Thereby, the first conductor 27 and the second conductor 28 are fixed to the cabinet, for example. The second positioning member 162 penetrates through the third through hole, for example. Thereby, the third conductor is fixed to the cabinet, for example.

The first positioning member 161 and the second positioning member 162 are positioning pins 54, for example.

As shown in FIG. 1 to FIG. 3, an interconnection path is completed by using the bonding wire 31 as a connection conductor in combination with the conductors, for example. That is, the switching elements 191A to 191C mounted on the first mounting substrates 26aA, 26aB, and 26aC are electrically connected to the diodes 201A to 201C, the circuit patterns 101A, 101B, and 101C of the first mounting substrates 26aA, 26aB, and 26aC, and the first flat plate region 29a of the output conductor 29 by the bonding wire 31, for example. The circuit patterns of the first mounting substrates 26aA, 26aB, and 26aC are electrically connected to the protruding end of the first flat plate region 27a of the first conductor 27 by the bonding wire 31, for example.

As shown in FIG. 3, the first element mounting unit 71a and the first conductor 27 are connected together by a first connection wire 11, for example. The first conductive unit for a main electrode 71b and the third conductor (the output conductor 29) are connected together by a second connection wire 12, for example.

The second element mounting unit 72a and the first conductor 27 are connected together by a third connection wire 13, for example. The second conductive unit for a main electrode 71b and the third conductor (the output conductor 29) are connected together by a fourth connection wire 14, for example.

The first element mounting unit 73a and the third conductor (the output conductor 29) are connected together by a fifth connection wire 15, for example. The third conductive unit for a main electrode 73b and the second conductor 28 are connected together by a sixth connection wire 16, for example.

The bonding wire 31 may be used as the first connection wire 11 to the sixth connection wire 16, for example.

The gate signal input terminal 60a and the source terminal are electrically connected to the circuit pattern 101A to 101C on the first mounting substrates 26aA, 26aB, and 26aC by the bonding wire 31, for example. The gate signal input terminal 60b and the source terminal are electrically connected to the circuit patterns 101A to 101C on the first mounting substrates 26aA to 26aC by the bonding wire 31, for example.

As shown in FIG. 3, the first conductive unit for a control electrode 71c and the gate signal input terminal 60a are connected together by a first terminal wire 41, for example. The second conductive unit for a control electrode 72c and the gate signal input terminal 60a are connected together by a second terminal wire 42, for example. The third conductive unit for a control electrode 73c and the gate signal input terminal 60a are connected together by a third terminal wire 43, for example.

The bonding wire 31 may be used as the first terminal wire 41 to the third terminal wire 43, for example.

The switching elements 192A to 192C mounted on the second mounting substrates 26bA to 26bC are electrically connected to the diodes 202A to 202C, the circuit patterns 102A, 102B, and 102C of the second mounting substrates 26bA, 26bB, and 26bC, and the first flat plate region 28a of the second conductor 28 by the bonding wire 31. The circuit patterns 102A to 102C of the second mounting substrates 26bA to 26bC are electrically connected to the first flat plate region 29a of the output conductor 29 by the bonding wire 31.

Although three bonding wires 31 are illustrated in FIG. 1 to FIG. 3 for simplification of the drawings, there are no limitations on the number of bonding wires, and the number of wires may be increased or decreased as appropriate in accordance with the current capacity of the chip etc.

The first flat plate regions 27a and 28a of the first conductor 27 and the second conductor 28 are stacked, whereas the first flat plate region 29a of the output conductor 29 is not stacked on them but disposed singly. That is, the number of conductors stacked is decreased from three (three stages) to two (two stages). Thus, the interconnection length of the bonding wire 31 (the first to sixth connection wires) can be reduced in accordance with the decrease of the total thickness of the stacked unit. Consequently, the resistance of the bonding wire 31 is reduced, and the resistance of the whole element can be reduced. Furthermore, the inverter module can be thinned.

In the embodiment, the movable area of the bonding head for connecting the first conductor 27, the second conductor 28, and the output conductor 29, and the bonding wire 31 (the first to sixth connection wires) can be ensured easily. In particular, since the first flat plate region 29a of the first conductor 27 is configured such that its end protrudes from the first flat plate region 29a of the second conductor 28, the protruding portion (one end) of the first conductor 27 can be used as a wire connection portion. Therefore, wire bonding connection is possible even when all of the first conductor 27, the second conductor 28, and the output conductor 29 are made to have the same width. From this, the widths of the conductors (the first conductor 27, the second conductor 28, and the output conductor 29) and the insulating plate 53 can be set to a minimum width, and the whole module can be downsized as compared to conventional ones.

In the semiconductor module 10, the resin case 52 is shaped like substantially a frame in which the conductor support potions supporting the first conductor 27, the second conductor 28, the insulating plate 53, and the output conductor 29 are formed, and the resin case 52 thus configured is mounted on the heat sink 24. Each of the first conductor 27, the output conductor 29, and the heat sink 24 is a metal, or has a metal-plated surface. Hence, electrical insulation is made. By the configuration, part of the resin case 52 can be utilized as the insulating portion, and a dedicated insulating component can be omitted. Consequently, the configuration is simplified, and the number of assembly processes can be reduced. The yield is increased.

In the semiconductor module 10, the first conductor 27, the second conductor 28, and the output conductor 29 are fixed to the resin case 52 by fastening a plurality of points by what is called the thermal caulking method, rather than firmly fixed to the resin case 52 like insert molding. By appropriately designing the shapes of the positioning pin 54 of the resin case 52 and the positioning hole of the conductor, thermal stress in long-term use can be relaxed while the fixation between the conductors (the first conductor 27, the second conductor 28, and the output conductor 29) and the resin case 52 is maintained. The configuration can ensure the strength of the resin case 52 and improve long-term reliability.

From the above, a semiconductor module is obtained that can be downsized while suppressing the resistance and the inductance parasitic on the interconnection, can increase the yield while shortening the time required for the internal interconnection connection using the bonding wire 31, and can ensure the strength of the resin case 52 in long-term use.

The improvement of the semiconductor module that is a key component of an inverter device is required. To increase the efficiency of the semiconductor module, it is effective to reduce the amount of heat generation due to the current passage through the semiconductor module, that is, reduce loss, for example. A cooling system is provided in order to suppress the temperature increase due to current passage heat generation, for example. Since the volume of the cooling system is usually large, the cooling system is a factor in determining the size of the inverter device. The inverter device can be downsized by reducing loss.

In the semiconductor module, a power semiconductor element such as a switching element is housed. It is also effective to utilize the power semiconductor element with good efficiency. That is, it is preferable to use the power semiconductor element at values as close as possible to the permissible maximum values of the current-carrying ratings of the voltage, current, etc. of the power semiconductor element. It is also preferable to maintain long-term reliability even when the power semiconductor element is used under current-carrying conditions close to its permissible maximum values. The expansion of the current-carrying ratings of the current etc. of the semiconductor module is achieved by mounting a larger number of power semiconductor elements in the semiconductor module. The increasing of the efficiency of the semiconductor module and the downsizing of the cooling system are enabled by using SiC or GaN, which is low loss and has high temperature operability because of having a lower electric resistivity and a larger band gap than Si, as the power semiconductor element mounted.

To reduce the amount of heat generation of the semiconductor module, it is effective to reduce the amount of heat generation of the semiconductor element and reduce the amount of heat generation resulting from the resistance component of the internal interconnection of the element. For the former, it is effective to improve the properties of the semiconductor element by using SiC or GaN, which is low loss and has high temperature operability because of having a lower electric resistivity and a larger band gap than Si, or the like. For the latter, it is effective to reduce the resistance by appropriately designing the material, shape, and laying configuration of the interconnection. In the case where a large number of power semiconductor elements are mounted, the mounted power semiconductor elements greatly influence the yield of semiconductor modules.

When a wide gap semiconductor material such as SiC and GaN is used, it is difficult to obtain a wafer with few defects. In the case of using SiC, a thin film epitaxially grown on a SiC wafer is used as a channel layer to form a MOSFET, for example. The SiC wafer has a large number of threading defects called micropipes, which are also crystal defects, for example. If defects that have taken over from micropipes exist in the functional portion of the power semiconductor element such as a MOSFET or a diode in the thin film epitaxially grown, dielectric breakdown may be caused, and specifications such as the dielectric breakdown voltage cannot be satisfied. Since the density of micropipes of the SiC wafer is, for example, several/cm$^2$ or more, the semiconductor element includes micropipes stochastically. When a power semiconductor element using a large current is fabricated on a SiC wafer, dielectric breakdown will occur in a region where a micropipe exists, and the yield is therefore reduced. Also a wafer of a wide gap semiconductor such as a group III nitride such as GaN, diamond, etc., other than SiC, includes various crystal defects at high density, and the yield is reduced due to the crystal defects as in the case of the SiC wafer mentioned above.

In addition to the above matter, by reducing the surge voltage generated during current passage, the limitations of current-carrying conditions (voltage and current) can be relaxed, and use at a larger voltage or a larger current becomes possible. To reduce the surge voltage, it is effective to reduce the parasitic inductance of the circuit, and it is also effective to reduce the inductance parasitic on the internal interconnection of the element.

The embodiment mentioned above can provide a semiconductor module that can ensure high yield, can be downsized, and can ensure the improvement of assembly performance and the strength of the resin case while using a power semiconductor element of a wide gap such as SiC, for example.

The embodiment can provide high yield, and can provide a semiconductor module of high productivity.

Second Embodiment

Figure 7:
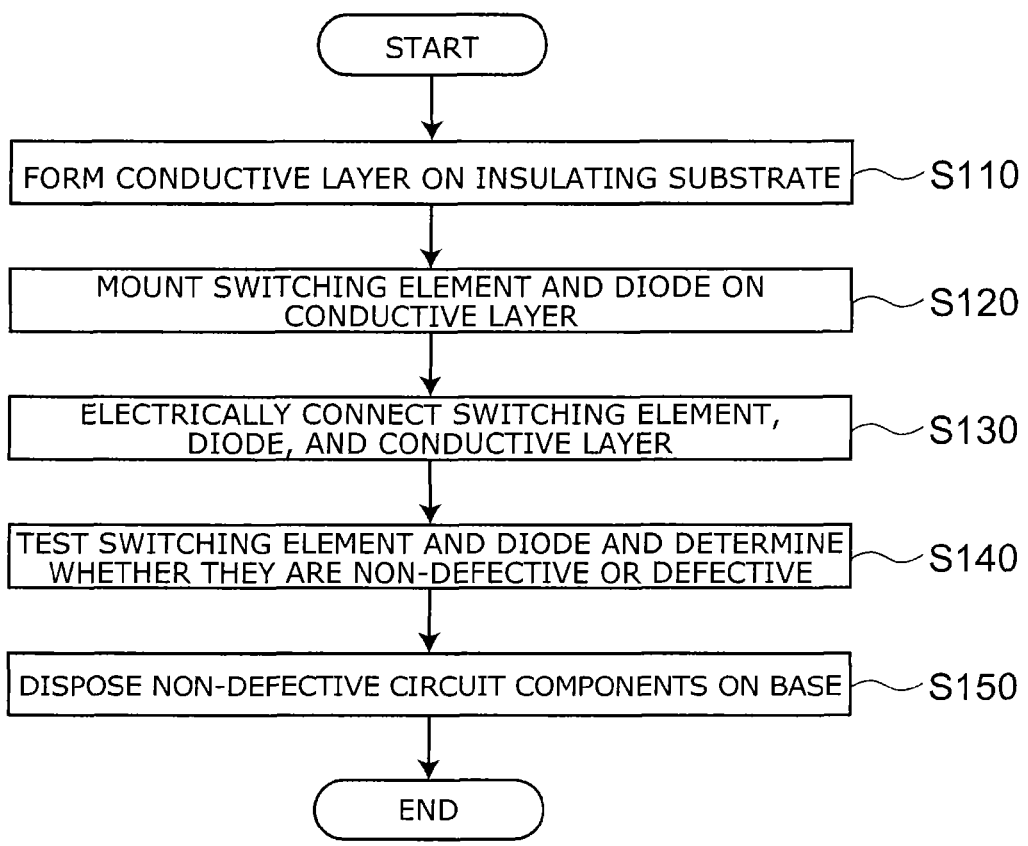
FIG. 7 is a flow chart showing a method for manufacturing a semiconductor module according to a second embodiment.

FIG. 7 is a flow chart showing a method for manufacturing a semiconductor module according to a second embodiment.

In the assembly of a semiconductor module, a circuit pattern including an element mounting unit, a conductive unit for a main electrode, and a conductive unit for a control electrode 71c are formed on an insulating substrate (S110). A switching element and a diode are mounted on the element mounting unit of the circuit pattern, for example (S120). The mounting is performed using solder, for example.

The switching element includes an element unit, a main electrode, and a control electrode, for example. The main electrode is provided on the upper surface of the element unit, for example. The control electrode is provided on the upper surface of the element unit, for example.

The diode includes a diode element unit and a diode electrode, for example. The diode electrode is provided on the upper surface of the diode element unit, for example.

The conductive unit for a main electrode, the main electrode, and the diode electrode are electrically connected by a main wire, for example (S130). The conductive unit for a control electrode and the control electrode are electrically connected by a control wire, for example (S130).

Thereby, a circuit component is formed.

Next, a probe 104 is brought into contact with at least part of the element mounting unit, at least part of the conductive unit for a main electrode, and at least part of the conductive unit for a control electrode 71c. Thereby, the characteristics of the switching element and the diode are investigated (S140). Based on the results of the investigation of the characteristics, a processing is performed in which it is determined whether the switching element and the diode are non-defective items or defective items (S140). Only circuit components in which both the switching element and the diode are determined as non-defective items in the test process are used in the subsequent processes, for example. The test process is performed on a plurality of circuit components, for example. By performing the test process on all the circuit components, the yield can be more enhanced.

Next, of the plurality of circuit components determined as non-defective items in the test process, the first circuit component (e.g. 26aA), the second circuit component (e.g. 26aB), and the third circuit component (e.g. 26bA) are disposed on a base, for example (S150).

At this time, the second circuit component is disposed between the first circuit component and the third circuit component. The first direction from the switching element (e.g. the first switching element) toward the diode (e.g. the first diode) in the first circuit component crosses (for example, is orthogonal to) the direction from the first circuit component toward the second circuit component. The first direction is the X-axis direction, for example. The direction from the switching element (e.g. the second switching element) toward the diode (e.g. the second diode) in the second circuit component is the same direction as the first direction (the X-axis direction). The direction from the switching element (e.g. the third switching element) toward the diode (e.g. the third diode) in the third circuit component is the opposite direction to the first direction (e.g. the –X-axis direction).

The components are electrically connected by the bonding wire 31. After that, a not-shown insulating mold is put in the resin case 52, and the upper opening of the resin case 52 is closed with a not-shown lid. Thus, the semiconductor module 10 is formed.

By the semiconductor module 10 obtained in the above way, electrical characteristics can be tested in a state of a mounting substrate, and only non-defective items can be selected to be mounted in the module; therefore, high yield can be ensured even when power semiconductors with low yield are used.

The embodiment can provide a semiconductor module of high productivity and a method for manufacturing the same.

Hereinabove, embodiments of the invention are described with reference to specific examples. However, the embodiment of the invention is not limited to these specific examples. For example, one skilled in the art may appropriately select specific configurations of components of semiconductor modules and methods for manufacturing the same such as circuit components, substrates, circuit patterns, switching elements, diodes, conductors, insulating members, electrodes, bases, cabinets, positioning members, and through holes from known art and similarly practice the invention. Such practice is included in the scope of the invention to the extent that similar effects thereto are obtained.

For example, in the embodiments, the numbers of switching elements and diodes mounted and the number of mounting substrates (circuit components) are not limited to those illustrated in the embodiments but may be increased or decreased as necessary. When those of an excessively small capacity are selected, the number of components connected in parallel is increased. In this case, the size of the whole device may be increased, the number of interconnections may be increased, and the self-inductance may be increased. In view of this, components may be appropriately selected in accordance with the purpose, use, etc. to manufacture an optimum semiconductor module. Although a heat sink is used as the base plate of the module in the embodiments, the base plate is not limited thereto but may be a cooler. The cooler may be an air cooling type, a water cooling type, or an oil cooling type. In the embodiments, arbitrary portions of the insulating member may be integrally formed, or may be divided and separated as appropriate.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor module comprising:
   a first circuit component including:
      an insulating first substrate;
      a first conductive layer provided on the first substrate and including a first element mounting unit;
      a first switching element provided on the first element mounting unit; and
      a first diode provided on the first element mounting unit;
   a second circuit component provided apart from the first circuit component in a second direction crossing a first direction from the first switching element toward the first diode and including:
      an insulating second substrate;
      a second conductive layer provided on the second substrate and including a second element mounting unit;
      a second switching element provided on the second element mounting unit; and
      a second diode provided on the second element mounting unit,
   a direction from the second switching element toward the second diode being the same direction as the first direction;
   a third circuit component, the second circuit component being disposed between the first circuit component and the third circuit component, the third circuit component including:
      an insulating third substrate;
      a third conductive layer provided on the third substrate and including a third element mounting unit;
      a third switching element provided on the third element mounting unit; and
      a third diode provided on the third element mounting unit,
   a direction from the third switching element toward the third diode being an opposite direction to the first direction; and
   a first conductor extending in the second direction;
   a second conductor extending in the second direction, at least part of the second conductor overlapping with the first conductor in a stacking direction crossing the first direction and the second direction;
   an insulating member provided between the first conductor and the at least part; and
   a third conductor provided apart from the first conductor, the second conductor, and the insulating member in the first direction and extending in the second direction,
   the first circuit component, the second circuit component, and the third circuit component being disposed between the first conductor, the second conductor, and the insulating member, and the third conductor,
   the first switching element including a first element unit, a first main electrode provided on an upper surface of the first element unit, and a first control electrode provided on the upper surface of the first element unit and apart from the first main electrode,
   the second switching element including a second element unit, a second main electrode provided on an upper surface of the second element unit, and a second control electrode provided on the upper surface of the second element unit and apart from the second main electrode,
   the third switching element including a third element unit, a third main electrode provided on an upper surface of the third element unit, and a third control electrode provided on the upper surface of the third element unit and apart from the third main electrode,
   the first conductive layer further including a first conductive unit for a main electrode electrically connected to the first main electrode and a first conductive unit for a control electrode electrically connected to the first control electrode,
   the second conductive layer further including a second conductive unit for a main electrode electrically connected to the second main electrode and a second conductive unit for a control electrode electrically connected to the second control electrode,
   the third conductive layer further including a third conductive unit for a main electrode electrically connected to the third main electrode and a third conductive unit for a control electrode electrically connected to the third control electrode,
   the first conductor being electrically connected to the first element mounting unit and the second element mounting unit,
   the second conductor being electrically connected to the third conductive unit for a main electrode,
   the third conductor being electrically connected to the first conductive unit for a main electrode, the second conductive unit for a main electrode, and the third element mounting unit.

2. The module according to claim 1, wherein
   the first switching element further includes a first element lower electrode provided between the first element unit and the first element mounting unit,
   the second switching element further includes a second element lower electrode provided between the second element unit and the second element mounting unit, and
   the third switching element further includes a third element lower electrode provided between the third element unit and the third element mounting unit.

3. The module according to claim 1, wherein the first conductor is a positive electrode-side conductor and the second conductor is a negative electrode-side conductor.

4. The module according to claim 3, further comprising:
   a positive electrode terminal electrically connected to the first conductor;
   a negative electrode terminal electrically connected to the second conductor; and
   an output terminal electrically connected to the third conductor.

5. The module according to claim 1, wherein
   the first diode includes a first diode element unit and a first diode upper electrode provided on an upper surface of the first diode element unit and the first diode upper electrode is electrically connected to the first main electrode and the first conductive unit for a main electrode,
   the second diode includes a second diode element unit and a second diode upper electrode provided on an upper surface of the second diode element unit and the second diode upper electrode is electrically connected to the second main electrode and the second conductive unit for a main electrode, and the third diode includes a third diode element unit and a third diode upper electrode provided on an upper surface of the third diode element unit and the third diode upper electrode is electrically connected to the third main electrode and the third conductive unit for a main electrode.

6. The module according to claim 5, wherein
the first diode further includes a first diode lower electrode provided between the first diode element unit and the first element mounting unit,
the second diode element further includes a second diode lower electrode provided between the second diode element unit and the second element mounting unit, and
the third diode element further includes a third diode lower electrode provided between the third diode element unit and the third element mounting unit.

7. The module according to claim 2, wherein
the first circuit component further includes:
  a first main wire connecting the first main electrode and the first conductive unit for a main electrode; and
  a first control wire connecting the first control electrode and the first conductive unit for a control electrode,
the second circuit component further includes:
  a second main wire connecting the second main electrode and the second conductive unit for a main electrode; and
  a second control wire connecting the second control electrode and the second conductive unit for a control electrode, and
the third circuit component further includes:
  a third main wire connecting the third main electrode and the third conductive unit for a main electrode; and
  a third control wire connecting the third control electrode and the third conductive unit for a control electrode.

8. The module according to claim 7, wherein the first main wire and the first control wire are bonding wires.

9. The module according to claim 1, wherein a length along the second direction of the first substrate is less than twice a length along the second direction of the first switching element and less than twice a length along the second direction of the first diode.

10. The module according to claim 1, wherein at least part of the first element mounting unit, at least part of the first conductive unit for a main electrode, and at least part of the first conductive unit for a control electrode serve as a probe space for a probe for electrical characteristic measurement to be brought into contact with.

11. The module according to claim 1, further comprising a base having an installation surface,
the first circuit component, the second circuit component, and the third circuit component being provided on the installation surface.

12. The module according to claim 11, wherein the base contains copper.

13. The module according to claim 11, wherein the base contains a ceramic plated with a metal.

14. The module according to claim 11, further comprising an insulating cabinet including a bottom surface portion,
at least part of the base, the first conductor, the second conductor, the third conductor, and the insulating member being provided on the bottom surface portion,
the base being provided between the first conductor, the second conductor, and the insulating member, and the third conductor.

15. The module according to claim 14, wherein
the cabinet further includes:
  a first positioning member vertically provided on the bottom surface portion; and
  a second positioning member vertically provided on the bottom surface portion and provided apart from the first positioning member,
the base is provided between the first positioning member and the second positioning member,
the first conductor has a first through hole penetrating through the first conductor in a stacking direction crossing the first direction and the second direction,
the second conductor has a second through hole penetrating through the second conductor in the stacking direction,
the third conductor has a third through hole penetrating through the third conductor in the stacking direction,
the first positioning member penetrates through the first through hole and the second through hole, and
the second positioning member penetrates through the third through hole.

16. The module according to claim 14, further comprising:
a first gate signal input terminal provided at a side wall of the cabinet and electrically connected to the first conductive unit for a control electrode and the second conductive unit for a control electrode; and
a second gate signal input terminal provided at the side wall of the cabinet and electrically connected to the third conductive unit for a control electrode,
the first circuit component, the second circuit component, and the third circuit component being disposed between the first gate signal input terminal and the second gate signal input terminal.

17. The module according to claim 16, further comprising:
a first terminal wire connecting the first conductive unit for a control electrode and the first gate signal input terminal;
a second terminal wire connecting the second conductive unit for a control electrode and the first gate signal input terminal; and
a third terminal wire connecting the third conductive unit for a control electrode and the first gate signal input terminal.

18. The module according to claim 15, wherein the cabinet contains a resin.

* * * * *